US 8,250,043 B2

(12) United States Patent
Yasa et al.

(10) Patent No.: US 8,250,043 B2
(45) Date of Patent: Aug. 21, 2012

(54) SYSTEM AND METHOD FOR COMPRESSION OF PARTIALLY ORDERED DATA SETS

(75) Inventors: Giridhar Appaji Nag Yasa, Bangalore (IN); Aditya Agnihotri, Bangalore (IN)

(73) Assignee: NetApp, Inc., Sunnyvale, CA (US)

( * ) Notice: Subject to any disclaimer, the term of this patent is extended or adjusted under 35 U.S.C. 154(b) by 617 days.

(21) Appl. No.: 12/193,830

(22) Filed: Aug. 19, 2008

(65) Prior Publication Data

US 2010/0049726 A1 Feb. 25, 2010

(51) Int. Cl.
*G06F 17/00* (2006.01)
(52) U.S. Cl. ........................................ 707/692; 707/693
(58) Field of Classification Search .......... 707/689–694, 707/699–702
See application file for complete search history.

(56) References Cited

U.S. PATENT DOCUMENTS

| | | | |
|---|---|---|---|
| 3,656,178 A | 4/1972 | De Maine et al. | |
| 4,570,217 A | 2/1986 | Allen et al. | |
| 5,124,987 A | 6/1992 | Milligan et al. | |
| 5,163,131 A | 11/1992 | Row et al. | |
| 5,202,979 A | 4/1993 | Hillis et al. | |
| 5,278,979 A | 1/1994 | Foster et al. | |
| 5,403,667 A | 4/1995 | Simoens | |
| 5,581,724 A | 12/1996 | Belsan et al. | |
| 5,732,265 A | 3/1998 | Dewitt et al. | |
| 5,819,292 A | 10/1998 | Hitz et al. | |
| 5,990,810 A | 11/1999 | Williams | |
| 6,061,770 A | 5/2000 | Franklin | |
| 6,081,875 A | 6/2000 | Clifton et al. | |
| 6,289,451 B1 | 9/2001 | Dice | |
| 6,341,341 B1 | 1/2002 | Grummon et al. | |
| 6,788,224 B2 * | 9/2004 | Leanza | 341/50 |
| 6,892,211 B2 | 5/2005 | Hitz | |
| 7,010,553 B2 | 3/2006 | Chen et al. | |
| 7,043,485 B2 | 5/2006 | Manley et al. | |
| 7,072,910 B2 | 7/2006 | Kahn et al. | |
| 7,079,053 B2 | 7/2006 | Kolavi | |
| 7,103,602 B2 | 9/2006 | Black et al. | |
| 7,124,305 B2 | 10/2006 | Margolus et al. | |
| 7,127,577 B2 | 10/2006 | Koning et al. | |
| 7,162,662 B1 | 1/2007 | Svarcas et al. | |
| 7,289,643 B2 | 10/2007 | Brunk et al. | |
| 7,333,993 B2 | 2/2008 | Fair | |
| 7,475,098 B2 | 1/2009 | Patterson et al. | |
| 2001/0037431 A1 * | 11/2001 | Hamamoto et al. | 711/115 |

(Continued)

FOREIGN PATENT DOCUMENTS

CN 1 786 939 6/2006

(Continued)

OTHER PUBLICATIONS

Microsoft Dictionary, Microsoft Press, 4 pages, 2002.*

(Continued)

*Primary Examiner* — Wilson Lee
(74) *Attorney, Agent, or Firm* — Cesari and McKenna, LLP

(57) ABSTRACT

A system and method for compression of partially ordered data sets is provided. A first record of the data set is compressed by encoding the record using a Fibonacci encoding technique. Thereafter, for each subsequent record N, the N−$1^{st}$ record is subtracted from the $N^{th}$ record before encoding the result, thereby allowing each subsequent record to store the difference (or delta) from the previous record.

21 Claims, 4 Drawing Sheets

U.S. PATENT DOCUMENTS

| | | | |
|---|---|---|---|
| 2002/0194529 A1 | 12/2002 | Doucette et al. | |
| 2004/0030668 A1 | 2/2004 | Pawlowski et al. | |
| 2004/0083245 A1 | 4/2004 | Beeler | |
| 2007/0255758 A1 | 11/2007 | Zheng et al. | |
| 2009/0190850 A1* | 7/2009 | Tang ............................ | 382/251 |

FOREIGN PATENT DOCUMENTS

| | | |
|---|---|---|
| EP | 1349 089 | 1/2003 |
| EP | 1 995 877 | 11/2008 |
| IN | 938/DEL/2007 | 4/2007 |
| WO | WO 02/08956 | 1/2002 |
| WO | WO 2007/0127360 | 11/2007 |
| WO | WO 2008/005211 | 1/2008 |
| WO | WO 2008/005212 | 1/2008 |
| WO | WO 2008/153821 | 12/2008 |

OTHER PUBLICATIONS

Dictionary of Computer Science, Engineering and Technology, CRC Press, 1 page, 2001.*

Microsoft Computer Dictionary, Microsoft Press, 2002, definitions on Fingerprint, identifier, descriptor, virtual memory, tape, and tape drive.*

Dictionary of Computer Science, Engineering and Technology, CRC Press, 2001.*

Hong, et al., Duplicate Data Elimination in a SAN File System, Proceedings of the 21$^{st}$ IEEE / 12$^{th}$ NASA Goddard Conference on Mass Storage Systems and Technologies (2004), 304-314.

Howard, John H, et al., Scale and Performance in a Distributed File System, Carnegie Mellon University, CMU-ITC-87-068, Aug. 5, 1987, 33 pages.

Howard, John H., An Overview of the Andrew File System, Carnegie Mellon University, CMU-ITC-88-062 1988, 6 pages.

Howard, John, H. et al., Scale and performance in a distributed file system, ACM Trans. Computer. System., 6(1). Feb. 1988 pp. 51-81.

Kazar, Michael L., et al., Decorum File System Architectural Overview, USENIX Summer Conference, Anaheim, California, 1990, 13 pages.

Kemper, Alfons, et al., Performance Tuning for SAP R/3, Data Engineering Journal 22, Feb. 1999 pp. 33-40.

Kent, Jack et al., Optimizing Shadow Recovery Algorithms, IEEE Transactions on Software Engineering, 14(2): 155-168, Feb. 1988.

Kistler, et al., Disconnected Operation in the Coda File System, ACM Transactions on Computer Systems, vol. 10, No. 1, Feb. 1992, pp. 3-25.

Lorie, Raymond, A, Physical Integrity in a large segmented database, ACM Trans. Database Systems, 2(1): 91-104, Mar. 1977.

Muthitacharoen, Athicha, et al., A Low-bandwidth Network File System, ACM SOSP. Proceedings of the ACM Symposium on Operating Systemprinciples, ACM, US, XP-002405303. Oct. 21, 2002, pp. 174-187.

National Institute of Standards and Technology, Federal Information Processing Standards Publication: The Keyed-Hash Message Authentication Code (HMAC), FIPS PUB 198, Information Technology Laboratory, Gaithersburg, Maryland, Mar. 2002, 20 pages.

Ousterhout, John et al., Beating the I/O Bottleneck: A Case for Log-Structured File Systems, Technical Report, Computer Science Division, Electrical Engineering and Computer Sciences, University of California at Berkeley, Oct. 30, 1988, 18 pages.

Patterson, D., et al., A Case for Redundant Arrays of Inexpensive Disks (RAID), Technical Report, CSD-87-391. Computer Science Division, Electrical Engineering and Computer Sciences, University of California at Berkeley (1987), 26 pages.

Patterson, D., et al., A Case for Redundant Arrays of Inexpensive Disks (RAID), SIGMOD International Conference on of Data, Chicago, IL, USA, Jun. 1-3, 1988, SIGMOD Record (17):3:109-16 (Sep. 1988).

PCT Notification of Transmittal of The International Search Report and the Written Opinion of the International Searching Authority, or the Declaration, International Filing Date: Apr. 26, 2007, International Application No. PCT/US2007/010222, Applicant: Network Appliance, Inc., Date of Mailing: Apr. 15, 2008, pp. 1-15.

PCT Notification of Transmittal of the International Search Report and the Written Opinion of the International Searching Authority, or the Declaration, International Filing Date: Jun. 25, 2007, International Application No. PCT/US2007/014664, Applicant: Network Appliance, Inc., Date of Mailing: Apr. 9, 2008, pp. 1-12.

PCT Notification of Transmittal of the International Search Report and the Written Opinion of the International Searching Authority, or the Declaration, International Filing Date: Jun. 25, 2007, International Application No. PCT/US2007/014666, Applicant: Network Appliance, Inc., Date of Mailing: Feb. 22, 2008, pp. 1-18.

PCT Notification of Transmittal of the International Search Report and the Written Opinion of the International Searching Authority, or the Declaration, International Filing Date: May 29, 2008, International Application No. PCT/US2008/006805, Applicant: Network Appliance, Inc., Date of Mailing: Oct. 27, 2008, pp. 1-15.

PCT Notification of Transmittal of the International Search Report and the Written Opinion of the International Searching Authority, or the Declaration, International Filing Date: Aug. 18, 2009, International Application No. PCT/US2009/004712, Applicant: NatApp, Inc., Date of Mailing: Mar. 5, 2010. 16 pages.

Peterson, Zachary Nathaniel Joseph, Data Placement for Copy-on-Write Using Virtual Contiguity, University of CA, Santa Cruz, Master of Science in Computer Science Thesis, Sep. 2002.

Quinlan, Sean, A Cached WORM File System, Software-Practice and Experience, 21(12):1289-1299 (1991).

Reichenberger, C., Delta Storage for Arbitrary Nontext Files, Proceedings of the 3$^{rd}$ International Workshop on Software Configuration Management; Trondheim, Norway, Jun. 1999, ACM, pp. 144-152.

Rosenblum, Mendel, et al. The Design and Implementation of a Log-Structured File System Jul. 24, 1991 pp. 1-15.

Rosenblum, Mendel, The Design and Implementation of a Log-Structured File System, 1992, pp. 1-93.

Rosenblum, Mendel, et al., The Design and Implementation of a Log-Structured File System, In Proceedings of ACM Transactions on Computer Systems, (10)1:26-52. Feb. 1992.

Rosenblum, Mendel, et al., The LFS Storage Manager, Computer Science Division, Electrical Engin. and Computer Sciences, Univ. of CA, presented at Summer '90 USENIX Technical Conference. Anaheim, CA Jun. 1990, 16 pages.

Schiefer, Berni, et al., DB2 Universal Database Performance Tuning, Data Engineering Journal 22, Feb. 1999 pp. 12-19.

Seltzer, Margo I., et al., Journaling Versus Soft Updates: Asynchronous Meta-Data Protection in File Systems, Proceedings of 200 USENIX Annual Technical Conference, Jun. 18-23, 2000.

Shasha, Dennis, Tuning Time Series Queries in Finance: Case Studies and Recommendations, Data Engineering Journal 22, Feb. 1999 pp. 41-47.

Sidebotham, Bob, Volumes: The Andrew File System Data Structuring Primitive, EEUG Conference Proceedings, Manchester, UK, Autumn 1986.

Subramanian, Muralidhar, et al., Performance Challenges in Object-Relational DBMSs, Data Engineering Journal 22, Feb. 1999 pp. 28-32.

Weikum, Gerhard, et al., Towards Self-Tuning Memory Management for Data Servers, Data Engineering Journal 22, Feb. 1999 pp. 3-11.

West, Michael, et al, The ITC Distributed File System: Prototype and Experience, Carnegie-Mellon University, Technical Report CMU-ITC-040, Mar. 1985, 17 pages.

Wikipedia, "Fibonacci Coding", Retrieved from the Internet: URL: http://web.archive.org/web/20071209200256/http://en.wikipedia.org/wiki/tibonacci_coding>, Document date: Dec. 9, 2007, Document Retrieval Date, Jan. 2, 2010, 3 pages.

Wikipedia, "Delta Encoding", Retrieved from the Internet: URL: http://web.archive.org/web/20071228063620/http://en.wikipedia.org/wiki/delta_encoding>. Document date: Dec. 28, 2007, Document Retrieval Date: Jan. 2, 2010, 3 pages.

Zayas, Edward R., AFS-3 Programmer's Reference: Architectural Overview, Transarc Corporation, Pittsburgh, PA, 1.0 edition 1991, 37 pages.

U.S. Appl. No. 11/414,600, filed Apr. 28, 2006, entitled System and Method for Sampling Based Elimination of Duplicate Data, by Ling Zheng, et al., 25 pages.

U.S. Appl. No. 11/105,895, filed Apr. 2005, Zheng et al.

Akyurek, Sedat, Placing Replicated Data to Reduce Seek Delays, Department of Computer Science, University of Maryland, UMIACS-TR-91-121, CS-TR-2746, Aug. 1991.

Bilenko, Mikhail, et al., "Adaptive Duplicate Detection Using Learnable String Similarity Measures". Published in Proceedings of the Ninth ACM SIGKDD International Conference on Knowledge, Aug. 23, 2003, pp. 1-10.

Bitton, Dina. Disk Shadowing, Proceedings of the 14.sup.th VLDB Conference, LA, CA (1988). 8 pages.

Business Wire, SEPATON Announces Next Generation Data De-Duplication Software; Delivers Industry's Highest Level of De-Duplication Without Affecting Backup Performance, Business Wire, May 2006, 3 pages.

Chaudhuri, Surajit, et al., Self-Tuning Technology in Microsoft SQL Server, Data Engineering Journal 22, Feb. 1999 pp. 20-27.

Chutani, Sailesh, et al., The Episode File System, In Proceedings of the USENIX Winter 1992, 18 pages.

Coyne, Robert A., et al., Storage Systems for National Information Assets, Proc. Supercomputing 92, Minneapolis, Nov. 1992, pp. 626-633.

Crochemore, Maxime, et al., Pattern Matching and Text Compression Algorithms, dated Jan. 8, 2003, retrieved from http://citeseer.comp.nus.edu.sg/595025.html, 50 pages.

$EMC^2$, Celerra File Server Architecture for High Availability, $EMC^2$ Corporation, Aug. 1999, 12 pages.

Finlayson, Ross S., et al., Log Files: An Extended File Service Exploiting Write-Once Storage Department of Computer Science, Stanford University, Report No. STAN-CS-87/1177, Sep. 1987, 14 pages.

Gray, Jim, et al., The Recovery Manager of the System R Database Manager, ACM Computing Surveys, (13)2:223-242 1981, 20 pages.

Hecht, Matthew S., et al. Shadowed Management of Free Disk Pages With a Linked List, ACM Transactions on Database Systems, 8/4, Dec. 1983, pp. 503-514.

Hitz, Dave et al., File System Design for an NFS File Server Appliance, Technical Report 3002. Rev. C3/95, presented Jan. 19, 1994, USENIX Winter 1994, 23 pages.

Hernandez, Mauricio A., et al., "Real-world Data is Dirty: Data Cleansing and the Merge/Purge Problem". Published in Data Mining and Knowledge Discovery, vol. 2, 1998, pp. 1-31 (48 pages).

Kazar, Michael L., Synchronization and Caching Issues in the Andrew File System, Carnegie Mellon University, CMU-ITC-88-063, Jan. 1988, 12 pages.

Lee, Mong Li, et al., IntelliClean: a Knowledge-based Intelligent Data Cleaner, published by ACM International Conference on Knowledge Discovery and Data Mining, 2000, pp. 290-294.

* cited by examiner

SYSTEM AND METHOD FOR COMPRESSION OF PARTIALLY ORDERED DATA SETS

FIELD OF THE INVENTION

The present invention relates generally to data storage compression and, more specifically, to compressing partially ordered data sets.

BACKGROUND OF THE INVENTION

Data storage is a central part of many industries that operate in archival and compliance application environments, such as banks, government facilities/contractors and securities brokerages. In many of these environments, one or more storage systems are used to store selected sets of data, e.g., electronic-mail messages, financial documents and/or transaction records, in an immutable manner, possibly for long periods of time. Typically, data backup operations are performed on the storage system to ensure the protection and restoration of such data sets in the event of a failure. However, backup operations often result in the duplication of data on backup storage resources, such as disks, causing inefficient consumption of the storage space on the resources.

One form of long term archival storage is the storage of data on electronic tape media. Noted disadvantages of physical tape media include a slow data access rate and the added requirements for managing a large number of physical tapes. In response to these disadvantages, several storage system vendors provide virtual tape library (VTL) systems that emulate tape storage devices using a plurality of the disk drives. In typical VTL environments, the storage system serving as primary storage performs a complete backup operation of the storage system's data sets (e.g., in the form of backup data streams of a file system or other data store) to the VTL system. Multiple complete backup operations may occur over time thereby resulting in an inefficient consumption of storage space on the VTL system. It is thus desirable to reduce and/or eliminate duplicate data on the storage resources, such as disks associated with a VTL system, and ensure the storage of only single instances of data to thereby achieve storage compression.

One technique to eliminate duplicate data (data de-duplication) is described in U.S. Pat. No. 8,165,221, entitled SYSTEM AND METHOD FOR SAMPLING BASED ELIMINATION OF DUPLICATE DATA, by Ling Zheng, et al, the contents of which are hereby incorporated by reference. In such a data de-duplication system, the data may be replaced with a descriptor list or other set of partially ordered data, such as, e.g., a plurality of records, each of which describes a segment of the data. For example, if the data to be stored is ABCDA, the data may be replaced with a descriptor list as {L(A), L(B), L(C), L(D), L(A)}, where L(X) signifies the location of data segment X within a data store utilized by the system. Although the exemplary descriptor list references the location of data segment A twice, only one copy of segment A is actually stored within the data store, thereby resulting in a savings of storage space.

In a typical VTL environment, the data set may be measured in large quantities, e.g., gigabytes and/or terabytes. One disadvantage of using partially ordered data sets, such as descriptor lists in such an arrangement is that the descriptor lists may grow to the order of tens of megabytes. Depending on how often a backup operation is performed to the VTL system, the descriptor lists may consume a substantial amount of storage space. Furthermore, input/output operations required to read/save the descriptor lists may have a detrimental effect on the VTL system. Compression of the descriptor lists using conventional compression techniques, such as LZW, GZIP, etc. often has a minimal effect as these compression algorithms are designed to work on text files.

SUMMARY OF THE INVENTION

The present invention overcomes the disadvantages of the prior art by providing a system and method for compression of partially ordered data sets. According to the invention, when a new data set, e.g., a backup data stream, is provided by a storage system to, e.g., a server or, illustratively, a virtual tape library (VTL) system, the VTL system performs a data de-duplication technique that converts the data set into a descriptor list. Notably, the descriptor list contains a partially ordered list of previously stored data segments of the data set to be stored.

Specifically, the descriptor list illustratively comprises a partially ordered list of records, each of which references a segment of data stored within a data store. Multiple references to a single data segment may appear within the descriptor list when, e.g., duplicate data occurs within the data set. In accordance with an illustrative embodiment, the first record is compressed by encoding the record using a Fibonacci encoding technique. Thereafter, for each subsequent record N, the N−$1^{st}$ record is subtracted from the Nth record before encoding the result, thereby allowing each subsequent record to store the difference (or delta) from the previous record. The formation of deltas between subsequent records enables encoding of smaller values. Advantageously, this aspect of the invention exploits a feature of Fibonacci encoding wherein smaller values are encoded with shorter sequences, thereby resulting in improved overall compression.

BRIEF DESCRIPTION OF THE DRAWINGS

The above and further advantages of the invention may be better understood by referring to the following description in conjunction with the accompanying drawings in which like reference numerals indicate identical or functionally similar elements.

DETAILED DESCRIPTION OF AN ILLUSTRATIVE EMBODIMENT

The present invention provides a system and method for compression of partially ordered data sets. In accordance with an illustrative embodiment, the first record is compressed by encoding the record using a Fibonacci encoding technique. Thereafter, for each subsequent record N, the N−$1^{st}$ record is subtracted from the Nth record before encoding the result, thereby allowing each subsequent record to store the difference (or delta) from the previous record. The formation of deltas between subsequent records enables encoding of smaller values. Advantageously, this aspect of the invention exploits a feature of Fibonacci encoding wherein smaller values are encoded with shorter sequences, thereby resulting in improved overall compression.

A. Storage System Environment

Figure 1:
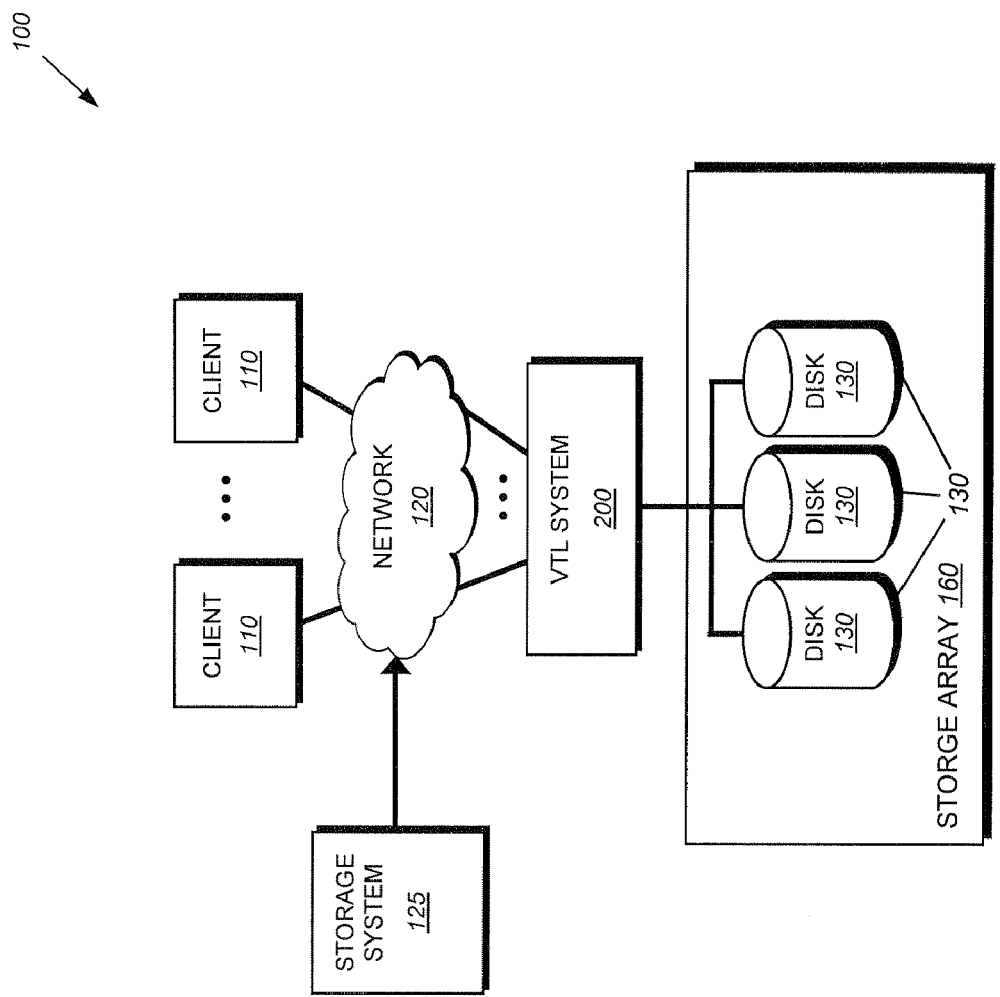
FIG. 1 is a schematic block diagram of an exemplary storage system environment including a virtual tape library (VTL) system in accordance with an illustrative embodiment of the present invention.

FIG. 1 is a schematic block diagram of a storage system environment 100 that may be advantageously used with the present invention. The storage system environment 100 comprises a storage system 125 interconnected with a plurality of clients 110 and a virtual tape library (VTL) system 200 by network 120. Illustratively, the network 120 may be embodied as an Ethernet network or a Fibre Channel (FC) network. The VTL system 200 illustratively implements a data de-duplication technique of the present invention that substantially eliminates duplicate data stored on one or more storage devices, such as disks 130, organized as a storage array 160.

In operation, the storage system 125 services data access requests from the clients 110. Each client 110 may be a general-purpose computer configured to execute applications and interact with the storage system 125 in accordance with a client/server model of information delivery. That is, the client may request the services of the storage system, and the system may return the results of the services requested by the client, by exchanging packets over the network 120. The clients may issue packets including file-based access protocols, such as the Common Internet File System (CIFS) protocol or Network File System (NFS) protocol, over TCP/IP when accessing information, such as data, in the form of data containers, such as files and directories. Alternatively, the client may issue packets including block-based access protocols, such as the Small Computer Systems Interface (SCSI) protocol encapsulated over TCP (iSCSI) and SCSI encapsulated over Fibre Channel (FCP), when accessing information in the form of data containers, such as blocks.

When an administrator of the storage system 125 desires to perform a backup operation, conventional tape backup software may be utilized with the storage system 125 to perform a backup operation to the VTL system 200. Illustratively, VTL system 200 appears to the storage system 125 as a remote tape drive; thus, the storage system 125 may perform a conventional tape backup operation to the VTL system 200 using the conventional tape backup software. Typically, each backup operation results in the copying of data sets in the form of an entire file system stored by the storage system 125 to the VTL system 200, e.g., as one or more backup data streams or "backups". A noted result of such copying is that the VTL system 200 may include significant amounts of duplicated data, i.e., data that remains common among each of the backups of storage system 125 and/or redundant data between backups of different clients 110. Illustratively, the VTL system 200 substantially eliminates the duplicate data utilizing a data de-duplication technique, to generate a descriptor list. The present invention is directed to a technique to compress such descriptor lists (or other sets of partially ordered data)

B. Virtual Tape Library System

Figure 2:
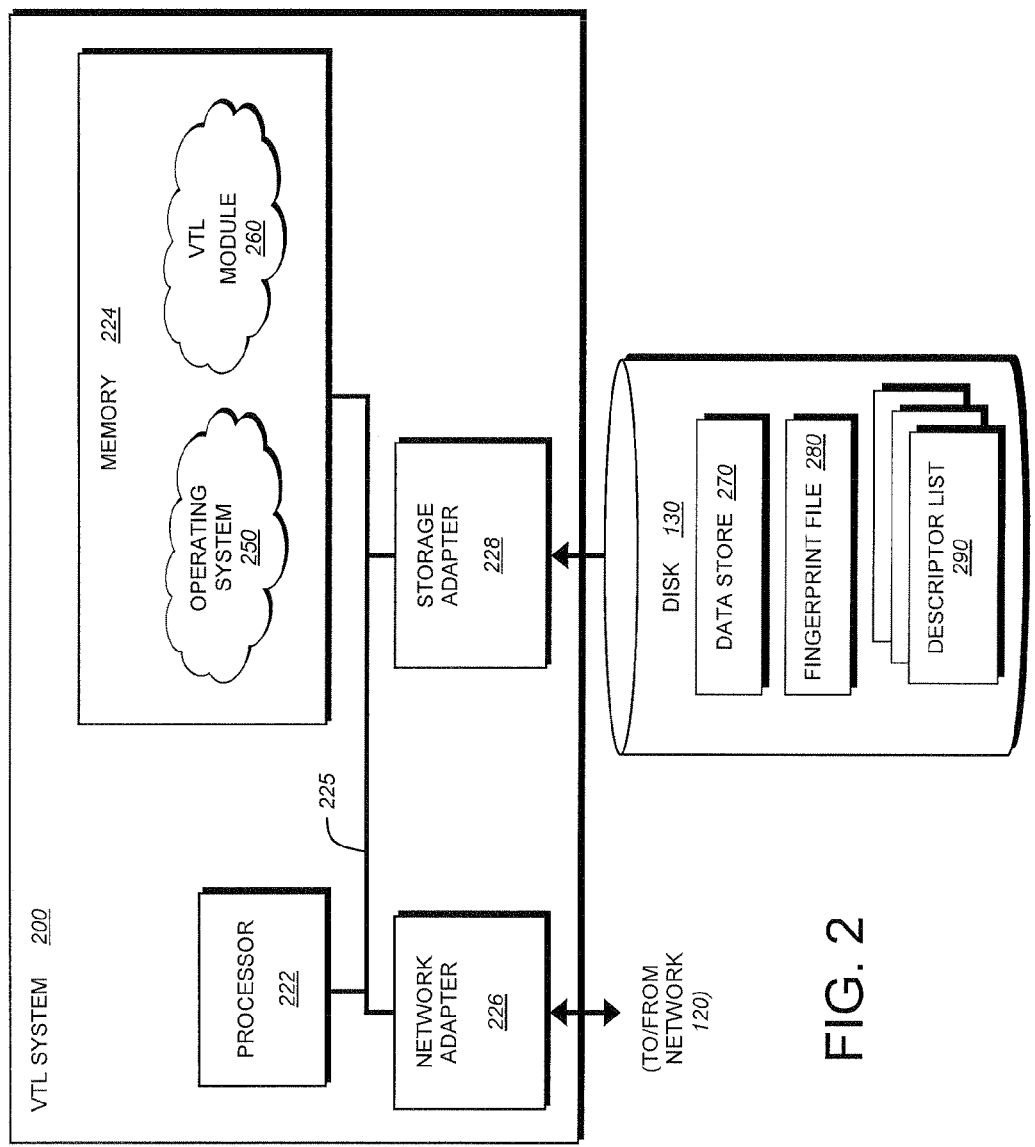
FIG. 2 is a schematic block diagram of a VTL system in accordance with an illustrative embodiment of the present invention.

FIG. 2 is a schematic block diagram of a VTL system 200 that may be advantageously used with the present invention. Illustratively, the VTL system 200 is a computer that provides storage service relating to the organization of information on storage devices, such as disks 130, of a local storage (disk) array 160. The VTL system 200 illustratively comprises a processor 222, a memory 224, one or more network adapters 226 and one or more storage adapters 228 interconnected by a system bus 225. Each network adapter 226 comprises the mechanical, electrical and signaling circuitry needed to connect the VTL system 200 to storage system 125 over the network 120. The VTL system 200 also includes an operating system 250 that interacts with various modules, such as virtual tape library (VTL) module 260, described further below. The operating system 250 may implement a logical data object store on disks 130 for use by, e.g., applications, such as VTL module 260 executing on the VTL system 200. As described herein, the logical data object store is illustratively embodied as a data store 270 and a fingerprint file 280.

In the illustrative embodiment, the memory 224 comprises storage locations that are addressable by the processor and adapters for storing software program code, such as operating system 250 and VTL module 260 and data structures. The processor and adapters may, in turn, comprise processing elements and/or logic circuitry configured to execute the software code and manipulate the data structures. It will be apparent to those skilled in the art that other processing and memory means, including various computer readable media, may be used for storing and executing program instructions pertaining to the inventive technique described herein.

The storage adapter 228 cooperates with the operating system 250 executing on the VTL system 200 to store and retrieve information requested on any type of attached array of writable storage device media such as video tape, optical, DVD, magnetic tape, bubble memory, electronic random access memory, micro-electro mechanical and any other similar media adapted to store information, including data and parity information. However, as illustratively described herein, the information is preferably stored on the disks 130, such as HDD and/or DASD, of local storage array 160. The storage adapter includes input/output (I/O) interface circuitry that couples to the disks over an I/O interconnect arrangement, such as a conventional high-performance, FC serial link topology.

As noted, the operating system 250 illustratively implements a logical data object store on disks 130. It should be also noted that in alternate embodiments, other forms of data organization may be utilized including, for example, a file system. As such, the description of utilizing a data object store should be taken as exemplary only. Furthermore, the VTL module 260 cooperates with the operating system 250 to implement virtual tape library functionality for the VTL system 200. In accordance with an illustrative embodiment of the present invention, the VTL module 260 also maintains partially ordered data sets, such as descriptor lists 290 describing data sets stored on VTL system 200.

C. Compression of Partially Ordered Data Sets

The present invention provides a system and method for compression of partially ordered data sets. According to the invention, when a new data set, e.g., a backup data stream, is provided by a storage system to, e.g., a server or, illustratively, a virtual tape library (VTL) system, the VTL system performs a data de-duplication technique that converts the data set into a descriptor list. Notably, the descriptor list contains a partially ordered list of previously stored data segments of the data set to be stored.

Specifically, the descriptor list illustratively comprises a partially ordered list of records, each of which references a segment of data stored within a data store. Multiple references to a single data segment may appear within the descriptor list when, e.g., duplicate data occurs within the data set. In accordance with an illustrative embodiment, the first record is compressed by encoding the record using a Fibonacci encoding technique. Thereafter, for each subsequent record N, the N−$1^{st}$ record is subtracted from the Nth record before encoding the result, thereby allowing each subsequent record to store the difference (or delta) from the previous record. The formation of deltas between subsequent records enables encoding of smaller values. Advantageously, this aspect of the invention exploits a feature of Fibonacci encoding wherein smaller values are encoded with shorter sequences, thereby resulting in improved overall compression.

Figure 3:
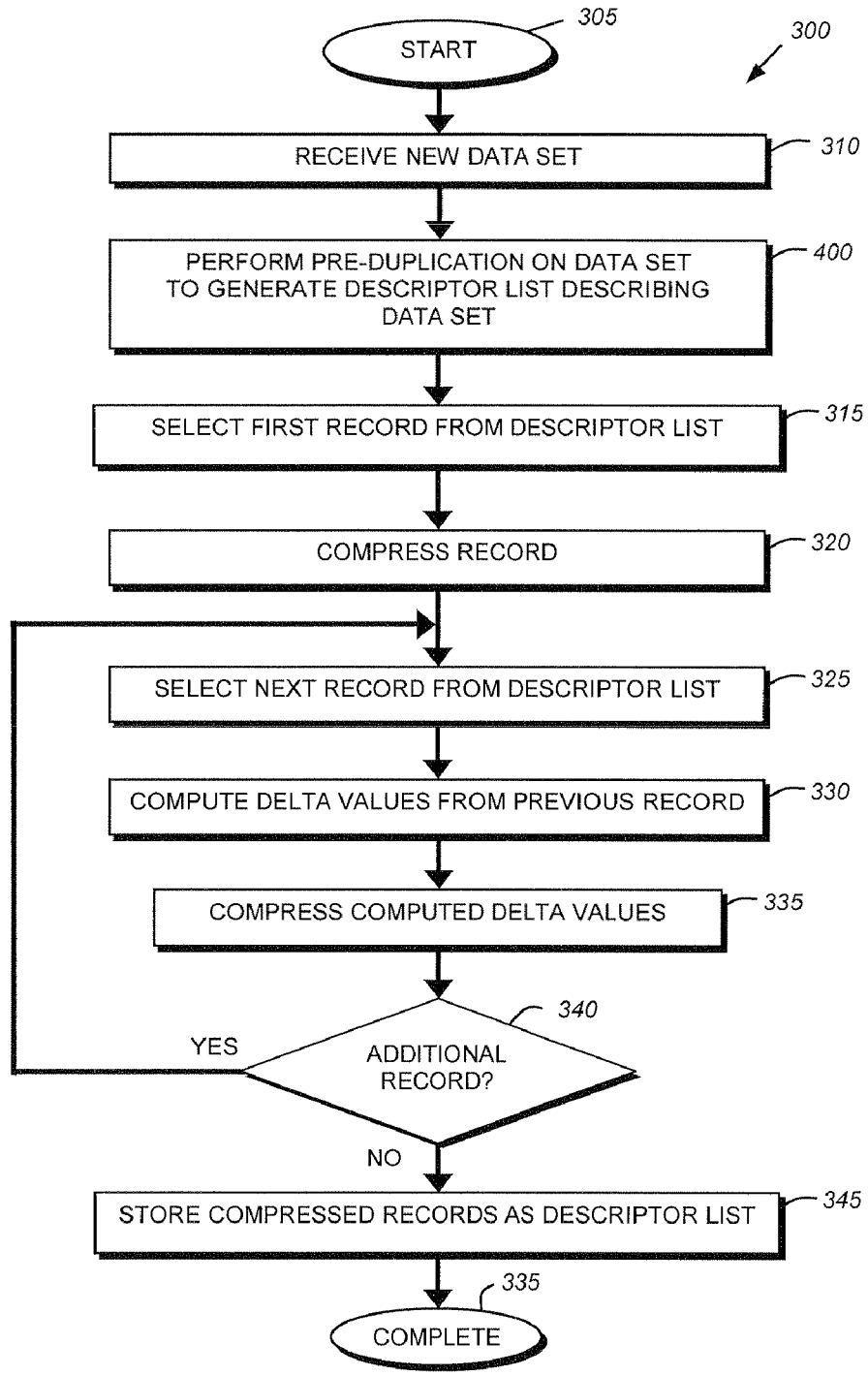
FIG. 3 is a flowchart detailing the steps of a procedure for performing compression of partially ordered data sets in accordance with an illustrative embodiment of the present invention.

FIG. 3 is a flowchart detailing the steps of a procedure 300 for compressing partially ordered data sets in accordance with an illustrative embodiment of the present invention. Illustratively, in certain empirical data samples, the principles of the present invention provide 5-10% better compression. However, the results may vary depending on the type of data being compressed, etc. As such, a 5-10% improvement in compression should be taken as exemplary only. The procedure 300 begins in step 305 and continues to step 310 where a new data set is received at a VTL server (such as VTL system 200) from a storage system (such as storage system 125). In response to receiving the new data set, a de-duplication procedure 400 is performed to generate a descriptor list describing the data set. It should be noted that the procedure 400 described further herein is exemplary only and that other techniques for generating a descriptor list may be utilized in accordance with alternative embodiments of the present invention.

Once the data set has been de-duplicated and a descriptor list generated, the VTL system 200 selects a first record from the descriptor list in step 315 and compresses the record in step 320. Compression is illustratively performed by encoding the record using Fibonacci coding; however, in alternative embodiments, other techniques for encoding may be utilized. Fibonacci coding is based on Zeckendorf's Theorem that states that any natural number can be represented as a sum of one or more unique Fibonacci numbers such that the sum does not include two consecutive Fibonnaci numbers. A Fibonnaci code for a number N is a bit sequence where the $k^{th}$ digit indicates whether the $k^{th}$ Fibonnaci number is present in the Zeckendorf sequence for N. For example, when N=12, the Fibonnaci code is 10101, which represents $1*1+0*2+1*3+0*5+1*8=1+3+8=12$. As a result, the last digit will always be set in the sequence. In the illustrative embodiment another 1 is added to the sequence as padding, e.g., N=12=101011. As a result of Zeckendorf's Theorem, there will not be two consecutive 1's within the coding output; however, by adding a 1 as padding, the present invention may demarcate variable length fields within a particular record.

For example, the data set S={1, 2, {2, 3, 4}, {3, 4}, 4} is encoded as:
{11 011 {011 0011 1011} {0011 1011} 1011}, which can be rewritten as:
{11011 01100111011 00111011 1011}.

Once the first record has been compressed, the next record from the descriptor list is selected in step 325. In step 330, delta values are computed from the previous record. The delta values are illustratively computed by, on an entry by entry basis, subtracting the values of the previous record from the currently selected record. For example, if S1={1, 2, {2, 3, 4}, {3, 4}, 4} and S2={7, 8, {9, 6, 8}, {6, 9} 12}, then the delta values are:

$$S2d = \{7-1, 8-2, \{9-2, 6-3, 8-4\}, \{6-3, 9-4\}, 12-4\}$$

$$= \{6, 6, \{7, 3, 4\}, \{3, 5\}, 8\}.$$

The computed delta values are then compressed by, e.g., Fibonacci encoding the record in step 335. Encoding the exemplary delta values for S2 gives:

$$S2d = 10011\ 10011\ 01011\ 0011\ 1011\ 0011\ 00011\ 000011$$

$$= 1001110011\ 0101100111011\ 001100011\ 000011$$

$$= 100111001101011001110110011000011.$$

In contrast, without the delta value computation, S2 would be encoded as:

$$S2 = \{7, 8, \{9, 6, 8\}, \{6, 9\}, 12\}$$

$$= 01011\ 000011\ 100011\ 10011\ 000011\ 10011\ 100011\ 101011$$

$$= 01011000011\ 100011100110000011\ 10011100011\ 101011$$

$$= 010110000111000111001100001110011100011101011.$$

As can be seen, by using delta computation, an additional seven bits are saved in this example. As will be appreciated by one skilled in the art, the amount of space saved due to delta compression will vary with the size of the computed deltas. For example, should numbers be encoded using conventional eight bit encoding, i.e., using a full byte of data, the number of bits utilized will be a multiple of 8 bits and therefore may be substantially larger than what has been shown above.

In step 340, a determination is made as to whether additional records exist within the descriptor list. If additional records exist, the procedure branches back to step 325 and the next record from the descriptor list is selected. However, if there are no additional records to be compressed, the procedure continues to step 345 where the compressed records are stored as the descriptor list describing the data set. The procedure then completes in step 350.

It should be noted that in alternative embodiments, the principles of the present invention may be utilized to compress partially ordered data sets that are not descriptor lists. As such, the description of compression of descriptor lists should be taken as exemplary only. Furthermore, the present invention may be utilized to compress descriptor lists after they have been written to one or more storage devices or may be utilized to compress descriptor lists prior to being written to the storage devices.

A further advantage of the present invention is that as data is compressed on a record basis, instead of, e.g., a per disk block basis, the compressed data may be optimally fit into disk blocks. This is in distinction to statistical compression techniques where there exists a difficulty in determining if the data will fit into a fixed size block, e.g., a 512 byte disk block. Thus, by using the principles of the present invention, the need to be concerned with the compressed data meeting a fixed size is obviated.

D. Exemplary Data De-Duplication

Figure 4:
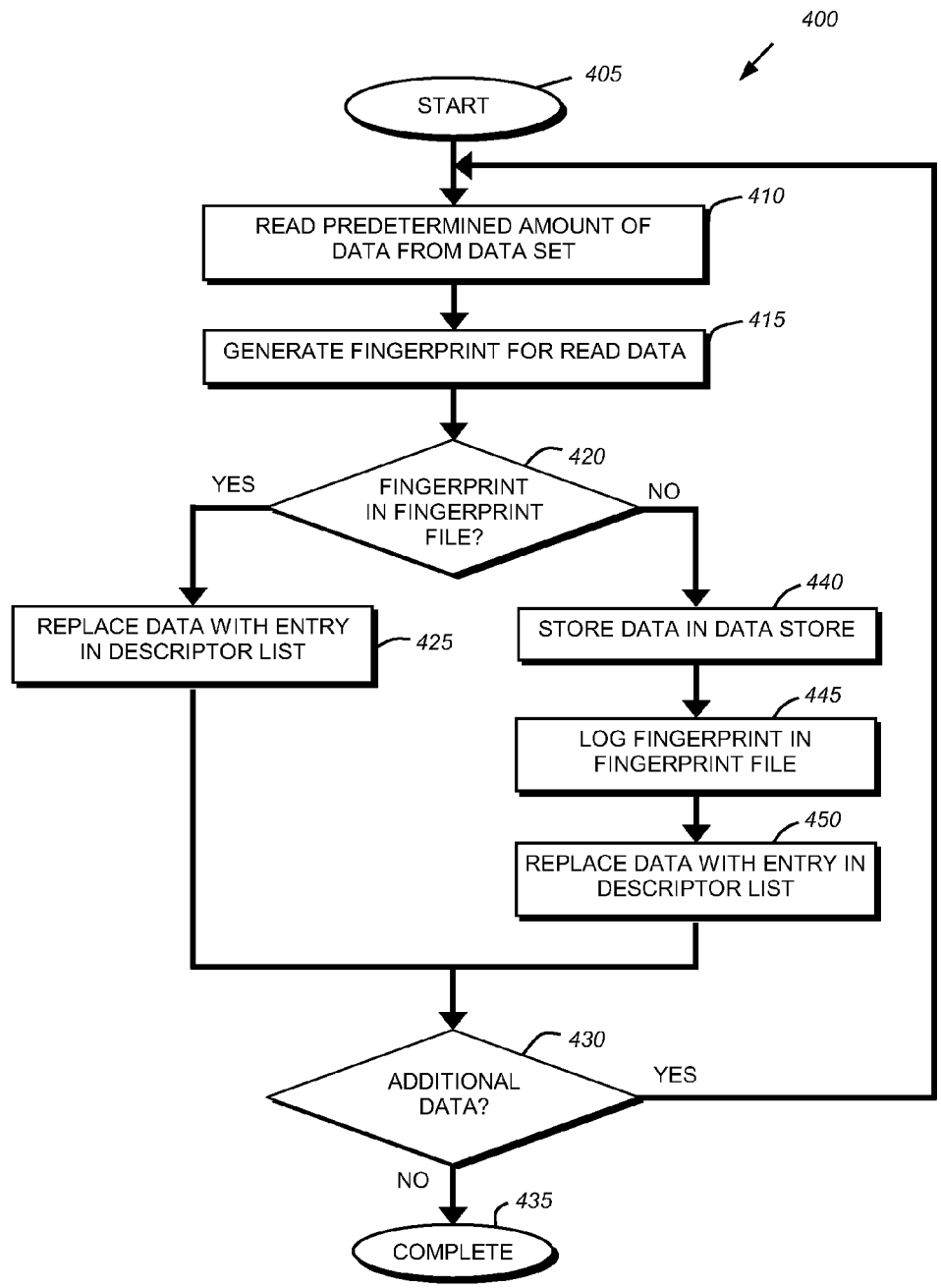
FIG. 4 is a flowchart detailing the steps of a procedure for performing a data de-duplication procedure in accordance with an illustrative embodiment of the present invention.

FIG. 4 is a flowchart detailing the steps of a data de-duplication procedure 400 that may be used to generate a descriptor list in accordance with an illustrative embodiment of the present invention. The procedure 400 begins in step 405 and continues to step 410 where the VTL module 260 reads a predetermined amount of data from the new data set of, e.g., a backup data stream. Illustratively, the amount of data read is determined by the size of data utilized in generating fingerprints. For example, if the de-duplication technique utilized 4 KB blocks for generation of fingerprints, then the system reads 4 KB of data from the data stream. The VTL module then generates a fingerprint of the read data in step 415. In accordance with an illustrative embodiment of the present invention, fingerprints comprise unique identifiers of a region of data. A fingerprint is illustratively generated by hashing the read data to generate a unique identifier of the data. However, in alternative embodiments, other techniques for generating a fingerprint may be utilized. As such, the use of a hash function to generate a fingerprint should be taken as exemplary only.

A determination is made in step 420 whether the fingerprint has been stored in the fingerprint file. If the fingerprint has been previously stored, then a copy of the data resides in the block store and may be de-duplicated. Accordingly, the procedure 400 branches to step 425 where the read data is replaced with an entry in the descriptor list describing the data set. Illustratively, the entry describes the location of the previously stored block within the data store that is identical to the read data. In step 430 a determination is made as to whether there is additional data to be read in the data set. If there is additional data, the procedure 400 loops back to step 410 where the VTL module reads the next predetermined amount of data from the data set. If there is no additional data, the procedure completes at step 435.

If, in step 420, it is determined that the generated fingerprint is not in the fingerprint file, the procedure branches to step 440 where the read data is stored in the data store. By storing the data in the data store, one copy of the data may be maintained and may be referenced any number of other times. Once the data is stored in the data store, the fingerprint is then stored in the fingerprint log file in step 445. In step 450, the data is then replaced with an appropriate entry in the descriptor list. The VTL module then determines, in step 430, whether there is additional data to be read in the data set. If so, the procedure 400 loops back to step 410 where the module 260 reads the next predetermined amount of data from the data set. If there is no additional data, the procedure completes at step 435.

It should be noted that the de-duplication technique described herein is exemplary only and that the principles of the present invention may be utilized with any de-duplication technique that generates partially ordered descriptor lists. More generally, the compression technique of the present invention may be utilized with any partially ordered data set. As such, the description of compression of descriptor lists should be taken as exemplary only.

The foregoing description has been directed to specific embodiments of this invention. It will be apparent, however, that other variations and modifications may be made to the described embodiments, with the attainment of some or all of their advantages. For instance, it is expressly contemplated that the teachings of this invention can be implemented as software, including a computer-readable medium having program instructions executing on a computer, hardware, firmware, or a combination thereof. Furthermore, it should be noted that while this description has been written in terms of VTL system, the teachings of the present invention are not so limited. The present invention may be utilized in any computer environment using any data store including, e.g., a file system. While the present invention has been written in terms of Fibonacci encoding, alternative encoding schemes that have similar properties may be utilized in alternative embodiments. Accordingly this description is to be taken only by way of example and not to otherwise limit the scope of the invention. Therefore, it is the object of the appended claims to cover all such variations and modifications as come within the true spirit and scope of the invention.

What is claimed is:

1. A method for compressing a partially ordered data set, comprising:
   receiving, at a computer, a data set;
   performing a first data de-duplication procedure on the received data set to generate the partially ordered data set, wherein the partially ordered data set comprises a descriptor list associated with the received data set, wherein the descriptor list comprises a plurality of records, each entry describing a segment of the received data set that has been stored in a logical object data store associated with the computer;
   selecting a first record from the partially ordered data set;
   compressing the first record using Fibonacci encoding;
   selecting a second record from the partially ordered data set;
   computing a delta value of the second record by subtracting the first record from the second record;
   compressing the delta value of the second record using Fibonacci encoding; and
   storing the compressed delta value to a storage device of the computer.

2. The method of claim 1 wherein compressing the delta value comprises compressing the delta value before writing the partially ordered data set to the storage device.

3. The method of claim 1 wherein generating the partially ordered data set comprises performing a data de-duplication procedure on a data set described by the partially ordered data set.

4. The method of claim 1 further comprising subtracting, for a Nth record in the partially ordered data set, a $N-1^{st}$ record from the Nth record to generate another delta value.

5. The method of claim 1 wherein the data set comprises a backup data set.

6. The method of claim 5 wherein the backup data set comprises a virtual tape library data set.

7. The method of claim 1 wherein the partially ordered data set comprises a descriptor list.

8. A system configured to compress a partially ordered data set, comprising:
   a processor of a computer configured to receive a data set and to perform a first de-duplication procedure on the received data set to generate the partially ordered data set, wherein the partially ordered data set comprises a descriptor list associated with the partially ordered data set, wherein the descriptor list comprises a partially ordered list of previously stored data segments;
   a module configured to select a first record from the partially ordered data set and further configured to compress the first record;
   the module further configured to select a second record from the partially ordered data set, and further configured to compute a delta value of the second record by subtracting the first record from the second record;
   the module further configured to compress the delta value of the second record; and
   the processor further configured to store the compressed delta value to a storage device of the computer.

9. The system of claim 8 wherein the module comprises a virtual tape library module that emulates one or more tape storage devices using a plurality of storage devices.

10. The system of claim 8 wherein the computer comprises a virtual tape library system that emulates one or more tape storage devices using a plurality of storage devices.

11. The system of claim 8 wherein the module is further configured to encode the delta value using Fibonacci encoding to compress the delta value.

12. The system of claim 8 wherein the module is further configured to perform a data de-duplication procedure on a data set described by the partially ordered data set to generate the partially ordered data set.

13. The system of claim 8 wherein the module is further configured to subtract the compressed first record from the second record to compute the delta value.

14. The system of claim 8 wherein the partially ordered data set comprises a set of unique identifiers.

15. The system of claim 14 wherein the unique identifiers comprise fingerprints generated during the first de-duplication procedure.

16. The system of claim 8 wherein the module is further configured to compress the delta value before writing the partially ordered data set to the storage device.

17. The system of claim 8 wherein the partially ordered data set describes a data set, wherein the data set comprises a tape backup data stream.

18. The system of claim 8 wherein the partially ordered data set comprises a descriptor list, wherein the descriptor list comprises a list of previously stored data segments stored at the computer.

19. The system of claim 8 further comprising a memory of the computer configured to store the partially ordered data set.

20. The system of claim 8 wherein the partially ordered data set comprises a descriptor list.

21. A physical computer-readable storage medium containing executable program instructions for execution by a processor, the physical computer-readable storage medium comprising:
program instructions that perform a first de-duplication procedure on a data set to generate a partially ordered data set;
program instructions that select a first record from the partially ordered data set, wherein the partially ordered data set comprises a descriptor list associated with the partially ordered data set, wherein the descriptor list comprises a partially ordered list of previously stored data segments;
program instructions that compress the first record;
program instructions that select a second record from the partially ordered data set;
program instructions that compute a delta value of the second record using the first record;
program instructions that compress the delta value of the second record; and
program instructions that store the compressed delta value to a storage device of a computer.

* * * * *